(12) United States Patent
Smith et al.

(10) Patent No.: US 9,281,848 B2
(45) Date of Patent: Mar. 8, 2016

(54) METHOD FOR ENCODING DATA IN BURSTS (75) Inventors: Guillaume Smith, Les Alluets le Roi (FR); Jerome Lacan, Toulouse (FR); Laurence Clarac, Toulouse (FR)

(73) Assignee: CENTRE NATIONAL D'ETUDES SPATIALES (FR)

( * ) Notice: Subject to any disclaimer, the term of this patent is extended or adjusted under 35 U.S.C. 154(b) by 80 days.

(21) Appl. No.: 14/127,721

(22) PCT Filed: Jun. 21, 2012

(86) PCT No.: PCT/EP2012/061923
§ 371 (c)(1),
(2), (4) Date: Dec. 19, 2013

(87) PCT Pub. No.: WO2012/175589
PCT Pub. Date: Dec. 27, 2012

(65) Prior Publication Data
US 2014/0136923 A1    May 15, 2014

(30) Foreign Application Priority Data
Jun. 21, 2011    (FR) .................................... 11 55444

(51) Int. Cl.
*H03M 13/00* (2006.01)
*H03M 13/11* (2006.01)
(Continued)

(52) U.S. Cl.
CPC .......... *H03M 13/6541* (2013.01); *H03M 13/05* (2013.01); *H03M 13/1174* (2013.01); *H03M 13/17* (2013.01); *H03M 13/27* (2013.01); *H03M 13/2732* (2013.01); *H03M 13/616* (2013.01); *H04L 1/0057* (2013.01); *H04L 1/0083* (2013.01); *H03M 13/1102* (2013.01); *H03M 13/136* (2013.01); *H03M 13/152* (2013.01);
(Continued)

(58) Field of Classification Search
CPC .......... H03M 13/6541; H03M 13/616; H03M 13/1174
See application file for complete search history.

(56) References Cited

U.S. PATENT DOCUMENTS 5,870,412 A    2/1999  Schuster et al.
7,831,895 B2 *  11/2010  Lin ................................ 714/800
(Continued)

OTHER PUBLICATIONS

International Preliminary Report on Patentability for corresponding application PCT/EP2012/061923 filed Jun. 21, 2012; Mail date Dec. 27, 2013.
(Continued)

*Primary Examiner* — Joseph D Torres
(74) *Attorney, Agent, or Firm* — Cantor Colburn LLP (57) ABSTRACT

A process of encoding information data in a sequence of bursts ( . . . , $B_{i-2}$, $B_{i-1}$, $B_i$, $B_{i+1}$, . . . ), each burst comprising a block of information symbols and a block of redundancy symbols. The block of redundancy symbols ($R_i$) of the current burst ($B_i$) of the sequence is generated by calculating a sum of a series of coding values relating to a series of bursts ($B_{i-2}$, $B_{i-1}$), each coding value of the series of coding values being obtained by a respective coding function applied to the block of information symbols of the corresponding burst of the series of bursts.

9 Claims, 3 Drawing Sheets (51) Int. Cl.
  *H03M 13/05* (2006.01)
  *H04L 1/00* (2006.01)
  *H03M 13/27* (2006.01)
  *H03M 13/17* (2006.01)
  H03M 13/13 (2006.01)
  H03M 13/15 (2006.01)
  H03M 13/29 (2006.01)
(52) U.S. Cl.
  CPC ....... *H03M 13/1515* (2013.01); *H03M 13/2957* (2013.01)

(56) References Cited

U.S. PATENT DOCUMENTS

2004/0034828 A1* 2/2004 Hocevar ........................ 714/800
2006/0068738 A1* 3/2006 Li et al. ........................ 455/277.1
2009/0006927 A1 1/2009 Sayadi et al.
2010/0031121 A1 2/2010 Ottavj et al.
2010/0180176 A1* 7/2010 Yosoku et al. ................ 714/752
2010/0281332 A1* 11/2010 Xu et al. ....................... 714/752

OTHER PUBLICATIONS

International Search Report for corresponding application PCT/EP2012/061923 filed Jun. 21, 2012; Mail date Oct. 4, 2012.
"Digital Video Broadcasting (DVB) Upper Layer FEC for DVB systems", Technical report, European Communications Standards Institute, ETSI, vol. 1., Feb. 1, 2011, XP014064504.
Mohamed Amine Ismail, et al., "A multi-Burst Sliding Encoding for Mobile Satellite TV Broadcasting", Dec. 24, 2008, pp. 1-24, XP055007412.

* cited by examiner

METHOD FOR ENCODING DATA IN BURSTS

FIELD OF THE INVENTION

The present invention relates to the technological field of data transfer in bursts, and more particularly to protection of the data to be transmitted against transmission errors, in particular the loss of entire bursts.

BACKGROUND OF THE INVENTION

In the context of the present document, bursts are assemblies of symbols representing data to be transmitted. Each burst is transmitted during a time period which is typically short relative to the latency time between the transmission of two successive bursts by one and the same service. The sequences of bursts from a plurality of services (e.g. different television channels) may be interleaved, but this will not subsequently be of any significance. Each burst comprises a data section (comprising one or more blocks of information symbols) and an error protection section (comprising one or more blocks of redundancy symbols). At the time of transmission, two types of symbol errors may arise: incorrect symbols are received or symbols are lost (or "erased"). The blocks of redundancy symbols constitute an error protection code.

Data transfer by burst proceeds, for example, in the context of a DVB (digital video broadcasting) system.

A conventional solution for generating a block of redundancy symbols of a burst consists in applying a coding function to the block of information symbols of the same burst. The result is "intra-burst" error protection, which allows the receiver to correct transmission errors within the block of information symbols of a received burst. For this approach to work, the burst to be corrected must arrive at its destination. "Intra-burst" protection is used in particular in digital video broadcasting, for example according to the standard DVB-H (digital video broadcasting—handheld). "Intra-burst" protection is not suitable for the erasure of entire bursts in the sequence received bursts. However, such situations are quite frequent for certain communication links, for example between a satellite and a mobile terminal.

Document US 2009/0006927 proposes "inter-burst" protection which makes it possible to remedy the loss of entire bursts. According to the process disclosed in said document, the data packets are grouped according to priority levels. Error correction code words specific to each group are generated on the data packets, belonging to the group, of at least two bursts of a first assembly of bursts. The correction codes thus obtained are transmitted in the error correction section of at least one burst of a second assembly of bursts.

Document US 2010/0031121 also describes an "inter-burst" protection process, in which an error correction code word is calculated on the basis of interleaved data originating from a plurality of bursts of an elementary data stream. Document U.S. Pat. No. 5,870,412 discloses an "interpacket" protection process, in which an error correction code composed of the XOR sum ("OR"-exclusive logic) of a predetermined number (>1) of preceding payload packets is attached to each packet.

Document ETSI TS 102 584 V1.1.1 (2008 December), "Digital Video Broadcasting (DVB); DVB-SH Implementation Guidelines" available on the website of the European Telecommunications Standards Institute (ETSI) describes a an "inter-burst" protection process (see in particular the illustrations on pages 62 and 63). According to this process, each transmitted burst contains an error correction section calculated on the basis of interleaved data from multiple previous bursts. Each burst of datagrams is distributed over B encoding matrices. An error correction code word is calculated for each encoding matrix and attached to a burst of datagrams, optionally after interleaving with one or more other error correction code words. Each item of data is protected just once, i.e. it is used in the calculation of just one error correction code word. Similar encoding processes are also known from ETSI TR 102 993 V.1.1.1 (2011 February) and "A Multi-Burst Sliding Encoding for Mobile Satellite TV Broadcasting" by M. Ismail et al., Research Report No. 6785, INRIA. These documents describe MPE-IFEC processes (producing "inter-burst" protection), in which the error correction code words are interleaved between them before the blocks thus obtained are attached to the bursts of datagrams. As in the previous references, each item of data is protected just once, i.e. it is used in the calculation of just one error correction code word.

BRIEF SUMMARY

The invention aims to achieve better data protection in a communication system using bursts.

The invention proposes a process of encoding information data in a sequence of bursts, of which each burst comprises a block of information symbols and a block of redundancy symbols (i.e. a protection or correcting code word block). The process implements "inter-burst" protection as a result of the block of redundancy symbols of the current burst of the sequence being generated from information symbols of the blocks of information symbols of a plurality of bursts of the sequence. According to the invention, generation of the block of redundancy symbols of the current burst includes the calculation of a sum (vectorial, i.e. coordinate by coordinate in the case of representation by coordinates) of a series of coding values relating to a series of bursts, each coding value of the series of coding values being obtained by a respective coding function applied to the block of information symbols of the corresponding burst of the series of bursts.

For example, if the series of bursts comprises the two bursts immediately preceding the current burst, a first coding value is calculated on the block of information symbols of the burst immediately preceding the current burst and a second coding value is calculated on the block of information symbols of the burst positioned in the sequence of bursts two places in front of the current burst. The block of redundancy symbols of the current burst is obtained, in this example, by vectorial addition of the first and second coding values.

It should be noted that, in the context of the present document, the term "coding" or "code" relate solely to the notion of correction coding. A coding function is thus a function which, when applied to a block of symbols, gives the redundancy symbols of a correcting code (for example of the Reed-Solomon, turbo-code, LDCP, BCH, Reed-Muller, Raptor, RaptorQ type etc.) relating thereto. It should be noted that, in the context of this document, the coding function uses all the symbols of the block to which it is applied in such a way that, if the value of any single symbol of the block is changed, the coding value (the result of the application of the coding function to the block of symbols) also changes. As far as the coding value is concerned, it should be noted that it normally corresponds to a vector of symbols, i.e. a number composed of a plurality of symbols. Preferably, the coding function corresponds to the multiplication by a generator matrix of a correcting code (for example of the Reed-Solomon, turbo-code, LDCP, BCH, Reed-Muller, Raptor, RaptorQ type etc.) or to the multiplication by a sub-matrix of such a generator matrix.

It should also be noted that the term "information" is used in the present context to distinguish the data or symbols to be protected (i.e. data blocks or redundancy symbols) from the redundancy symbols. Use of the term "information" does not therefore necessarily imply that the symbols, blocks, etc. thus qualified actually carry information (although this would normally be the case), or indeed only information. For example, some of the information symbols could be padding symbols added to reach a predefined block size.

The series of bursts may be a series of bursts which precede, e.g. immediately precede, the current burst. In practice, it will always be preferred for the series of bursts to be a series of bursts which follows (e.g. immediately follows) the current burst. The series of bursts could also extend before and after the current burst (wherein the latter may or may not be part of the series).

According to one advantageous embodiment of the invention, each burst comprises an ordered structure of blocks of information symbols and an ordered structure of blocks of redundancy symbols, the number ("interleaving depth" of the coding) of blocks of information symbols in the ordered structure of blocks of information symbols being equal to the number of blocks of redundancy symbols in the ordered structure of blocks of redundancy symbols. Generation of a block located in a certain position of the ordered structure of blocks of redundancy symbols of the current burst then comprises calculation of a sum of a series of coding values relating to the blocks located in the corresponding position in the ordered structure of blocks of information symbols of the bursts of the series of bursts. Each coding value of the series of coding values is in this case obtained by a respective coding function, applied to the block of information symbols located in the corresponding position in the ordered structure of blocks of information symbols of the corresponding burst of the series of bursts. It should be noted that the blocks of information symbols are not necessarily all the same size, and the same is true of the blocks of redundancy symbols.

If, in the previous example, each burst contains a string of blocks of information symbols and a string of blocks of redundancy symbols, the first coding value is calculated for each of the blocks of information symbols of the burst immediately preceding the current burst and the second coding value is calculated for each of the blocks of information symbols of the burst located in the sequence of bursts two places before the current burst. The block of redundancy symbols of the current burst located at a position "i" in the string is obtained by adding the first and second coding values calculated on the blocks of information symbols to the position "i" in the previous bursts.

The principle benefit of the method according to the invention is that all the information symbols of one and the same burst are protected by the same redundancy data, whereas in conventional inter-burst protection (see document ETSI TS 102 584 V1.1.1), these symbols are integrated into different code words, which causes differences in correction.

According to an advantageous variant of the invention, generation of the block of redundancy symbols of the current burst comprises generation of a first sub-block and of a second sub-block (and optionally of other sub-blocks) of the block of redundancy symbols of the current burst. Generation of the first sub-block includes:
calculation of a coding value by a coding function applied to the block of information symbols of a burst other than the current burst, or
calculation of a sum of a first series of coding values relating to a first series of bursts, each coding value of the first series of coding values being obtained by a respective coding function applied to the block of information symbols of the corresponding burst of the first series of bursts.

Generation of the second sub-block of the block of redundancy symbols of the current burst includes calculation of a sum of a second series of coding values relating to a second series of bursts, each coding value of the second series of coding values being obtained by a respective coding function, applied to the block of information symbols of the corresponding burst of the second series of bursts. According to this aspect of the invention, the first and second series of bursts are of different lengths.

According to this variant, the first and second sub-blocks of the block of redundancy symbols are therefore calculated from different series of bursts preceding the current burst. The first and second series of bursts may be series of bursts which precede, e.g. immediately precede, the current burst (but of different lengths). They may also be series which follow, e.g. immediately follow, the current burst in the sequence. According to another variant, one of the series precedes the current burst, while the other follows it. One and/or the other of the series could also extend either side of the current burst.

The advantage of this variant is to propose a good compromise between the correction capacity of the system, which is better when the series of bursts is long, and the decoding time, which is better when the series of bursts is short. This compromise makes it possible simultaneously to satisfy multiple receivers observing different noise levels.

Let us now consider the case where each burst comprises a number of blocks of information symbols and the same number of blocks of redundancy symbols, which are organised into respective ordered structures. In this case, the generation of a block of redundancy symbols in a position "i" in the ordered structure of blocks of redundancy symbols of the current burst comprises the generation of a first sub-block and of a second sub-block, generation of the first sub-block including:
calculation of a coding value by a coding function applied to the block of information symbols located in position "i" in the ordered structure of the burst other than the current burst, or
calculation of a sum of a first series of coding values relating to the blocks located in the corresponding position in the ordered structure of blocks of information symbols of the bursts of the first series of bursts, each coding value of the first series of coding values being obtained by a respective coding function applied to the block of information symbols located in position "i" in the ordered structure of blocks of information symbols of the corresponding burst of the first series of bursts;
and generation of the second sub-block including calculation of a sum of a second series of coding values relating to the blocks located in the corresponding position "i" in the ordered structure of blocks of information symbols of the bursts of the second series of bursts, each coding value of the second series of coding values being obtained by a respective coding function applied to the block of information symbols located in the corresponding position "i" in the ordered structure of blocks of information symbols of the corresponding burst of the second series of bursts.

It will be understood that the step of generating the block of redundancy symbols may be repeated for one or more subsequent bursts which in turn become the current burst.

Preferably, the coding functions remain unchanged during repetition of the step of generating the block of redundancy symbols for the following bursts. Alternatively, the coding functions are changed cyclically during repetition of the step of generating the block of redundancy symbols for the subsequent bursts.

The number of blocks of information symbols in the ordered structure of blocks of information symbols is advantageously in the range from 1 to 1000.

The information symbols and redundancy symbols are typically of elements of a finite field F, such as for example $F_2$ or $F_{256}$.

BRIEF DESCRIPTION OF THE DRAWINGS

Other distinctive features and characteristics of the invention will be revealed by the detailed description of some advantageous embodiments given below by way of example, with reference to the appended drawings, in which.

DESCRIPTION OF A PREFERRED EMBODIMENT

Figure 1:
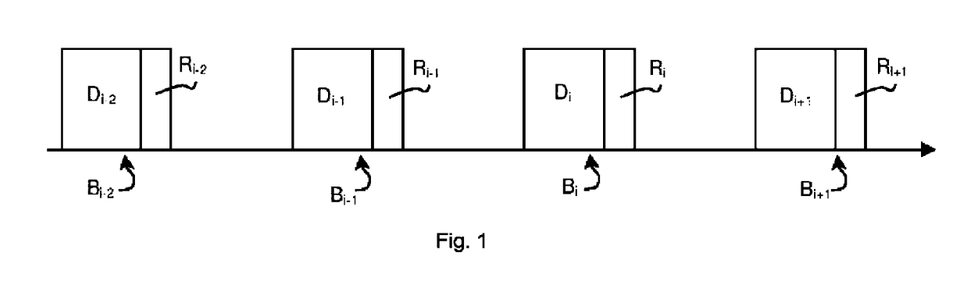
FIG. 1 is a diagram as a function of time of a sequence of bursts.

FIG. 1 shows a sequence of bursts $B_{i-2}$, $B_{i-1}$, $B_i$, $B_{i+1}$ of which each burst comprises a data section $D_{i-2}$, $D_{i-1}$, $D_i$ or $D_{i+1}$ respectively and an error protection section $R_{i-2}$, $R_{i-1}$, $R_i$ or $R_{i+1}$ respectively.

Figure 2:
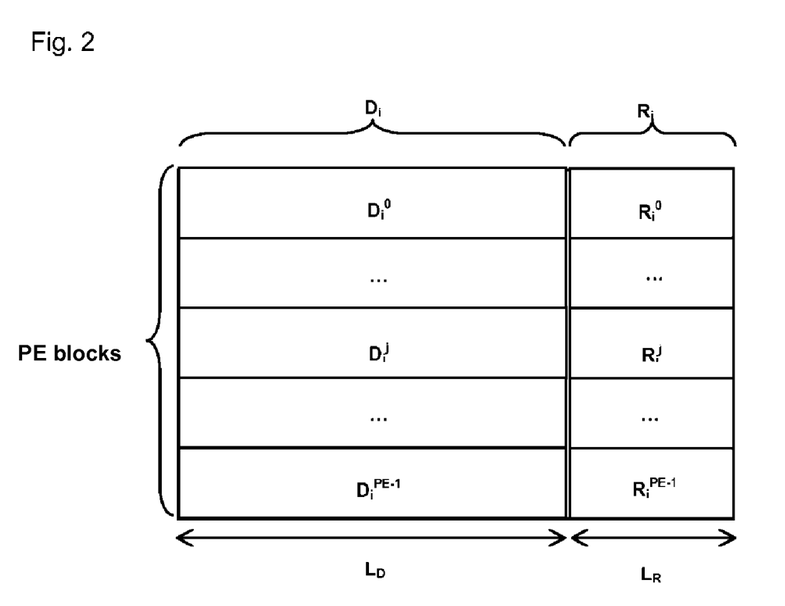
FIG. 2 is an illustration of the internal structure of a burst.

The internal structure of a burst is shown in greater detail in FIG. 2. The data section $D_i$ of the burst $B_i$ comprises PE blocks of information symbols $D_{i,0}$, $Di^1$, $Di^2$, ..., $Di^j$, $D_i^{PE-1}$. Each block $Di^j$, j=0, PE-1, contains $L_D$ symbols which are elements of a finite field F (for example $F_2$ or $F_{256}$). Likewise, the error protection section $R_i$ comprises PE blocks of redundancy symbols $Ri^0$, $Ri^1$, $Ri^2$, ..., $Ri^j$, $R_i^{PE-1}$. Each block $Ri^j$, j=0, PE-1, contains $L_R$ symbols which are elements of the finite field F.

Embodiments of the invention will firstly be illustrated below for the case PE=1. To facilitate notation, the superscript j, i.e. the number of the block of information or redundancy symbols in question, will be omitted.

A conventional solution for obtaining the block of redundancy symbols $R_i$ for the burst $B_i$ consists of applying a coding function f to the block of information symbols $D_i$; notation is as follows: $R_i = f(D_i)$. Since the symbols $r_u^{(i)}$, u=0, $L_R-1$, of the block $R_i$ are elements of the finite field F, the following applies:

$$r_u^{(i)} = \sum_{v=0}^{L_D-1} \alpha_{u,v} \cdot d_v^{(i)},$$

in which $d_v^{(i)}$, v=0, $L_D-1$, are symbols of the block $D_i$ (and therefore of the elements of the finite field F) and in which $\alpha_{u,v}$ are the coefficients in F of the generator matrix $\underline{A}_i$ of the correcting code (of the coding function), for example of the Reed-Solomon, turbo-code, LDPC, BCH, Reed-Muller, Raptor, RaptorQ or other type. The following therefore applies: $R_i = D_i \underline{A}_i$, in which $R_i$ and $D_i$ are considered as line vectors.

According to one preferred embodiment of the invention, it is proposed to construct the redundancy block $R_i$ of the burst $B_i$ from blocks of information symbols $D_{i-s}$, $D_{i-s+(t-1)}$ from a series of t bursts preceding the current burst $B_i$ in the sequence. The number s is an integer indicating the start of the series of t bursts, with s≥t. Specifically, the block of redundancy symbols $R_i$ of the current burst is obtained by addition (defined on $F^{L_R}$) of a series of coding values $(C_w)_{w=i-s, \ldots, i-s+(t-i)}$ relating to the series of bursts $(B_w)_{w=i-s, \ldots, i-s+(t-i)}$ preceding the current burst $B_i$, each coding value $C_w$ being obtained by a respective coding function applied to the block of information symbols $D_w$ of the burst $B_w$.

Strictly speaking, for a given burst $B_i$, the following applies:

$$c_u^{(w)} = \sum_{v=0}^{L_D-1} \alpha_{u,v}^{(w)} \cdot d_v^{(w)} \text{ et } r_u^{(i)} = \sum_{w=i-s}^{i-s+(t-1)} C_u^{(w)},$$

in which $c_u^{(w)}$, u=0, $L_R-1$ are the coefficients in F of the vector $C_w$ and in which the $\alpha_{u,v}^{(w)}$, u=0, ..., $L_R-1$, v=0, $L_D-1$ are the coefficients in F of the generator matrix $\underline{A}_w$ of the correcting code (i.e. of the coding function) associated with the position w of the series of bursts $(B_w)_{w=i-s, \ldots, i-s+(t-i)}$. The symbols $r_u^{(i)}$, u=0, $L_R-1$, again denote the coefficients in F of the block $R_i$. This may be written as follows:

$$R_i = \sum_{w=i-s}^{i-s+(t-1)} D_w \underline{A}_w.$$

A first way of obtaining the coefficients of the generator matrices $\underline{A}_w$, w=i-s, i-s+(t-1), is to perform random sampling.

To construct the generator matrix $\underline{A}_w$ in another way, let us consider a generator matrix of a conventional Reed-Solomon, turbo-code, LDPC, BCH, Reed-Muller, Raptor or RaptorQ correcting code or the like, with $t \cdot L_D$ rows and $t \cdot L_R$ columns. This generator matrix, which we will designate $\underline{M}$, uniquely characterises a systematic linear code of the dimensions k·no., k=t·$L_D$ being the length of the message and n=t·$L_D$+ t·$L_R$ the dimension of the code. The matrix $\underline{M}$ can be divided into t·t sub-matrices $\underline{M}_{\mu,\nu}$, μ=0, ..., t-1 and v=0, ..., t-1, each of which contains $L_D$ rows and $L_R$ columns:

$$\underline{M} = \begin{bmatrix} \underline{M}_{0,0} & \underline{M}_{0,1} & \cdots & \underline{M}_{0,t-1} \\ \underline{M}_{1,0} & \underline{M}_{1,1} & & \vdots \\ \vdots & & \ddots & \vdots \\ \underline{M}_{t-1,0} & \cdots & \cdots & \underline{M}_{t-1,t-1} \end{bmatrix}$$

It is proposed to calculate the redundancy blocks $R_i$ as follows:

$$R_i = \sum_{\beta=0}^{t-1} D_{i-s+\beta} \underline{M}_{\overline{i-s+\beta},i}.$$

in which the notation "$\overline{x}$" represents "x modulo t". For a given i, there is obtained for the generator matrix $\underline{A}_w$, w=i-s, i-s+ (t-1) the relationship $$\underline{A}_{i-s+\beta} = \underline{M}_{i-s+\beta,i}.$$

$\beta=0, \ldots t-1$. It should be noted that according to this construction, the (absolute) position i of the burst $B_i$ in the sequence of bursts is important, since the correcting code depends thereon, unless $$\underline{M}_{\mu,v} = \underline{M}_{\mu+1,v-1},$$

$\forall \mu v$. If $$\underline{M}_{\mu,v} = \underline{M}_{\mu+1,v-1},$$

$\forall \mu v$, the coding functions remain unchanged during repetition of the step of generating the block of redundancy symbols for the subsequent bursts. Otherwise, as the index i increases, the coding functions change cyclically, with a period t.

Figure 3:
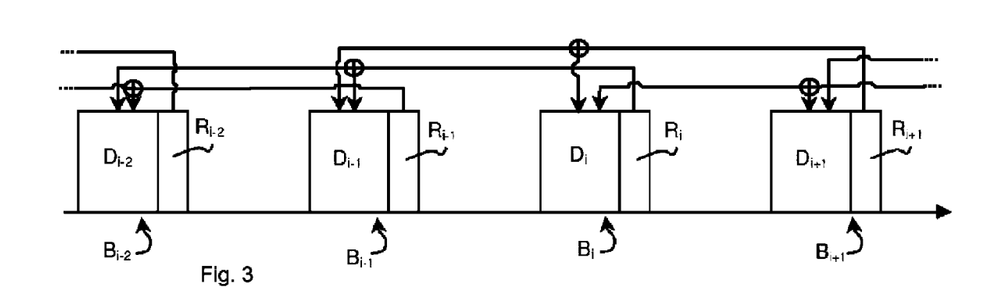
FIG. 3 is a schematic illustration of a first preferred embodiment of the invention.

FIG. 3 schematically illustrates the dependencies of the blocks of redundancy symbols $R_i$ where t=2 and s=2. Specifically, this may be written as follows: $R_2=D_0 \underline{M}_{0,0}+D_1 \underline{M}_{1,0}$; $R_3=D_1 \underline{M}_{1,1}+D_2 \underline{M}_{0,1}$; $R_4=D_2 \underline{M}_{0,0}+D_3 \underline{M}_{1,0}$; $R_5=D_3 \underline{M}_{1,1}+D_4 \underline{M}_{0,1}$, which may be visualised with the assistance of the following table:

|       | $R_2$              | $R_3$              | $R_4$              | $R_5$              | ...  |
|-------|--------------------|--------------------|--------------------|--------------------|------|
| $D_0$ | $\underline{M}_{0,0}$ |                    |                    |                    |      |
| $D_1$ | $\underline{M}_{1,0}$ | $\underline{M}_{1,1}$ |                    |                    |      |
| $D_2$ |                    | $\underline{M}_{0,1}$ | $\underline{M}_{0,0}$ |                    |      |
| $D_3$ |                    |                    | $\underline{M}_{1,0}$ | $\underline{M}_{1,1}$ |      |
| $D_4$ |                    |                    |                    | $\underline{M}_{0,1}$ | ...  |
| ...   |                    |                    |                    |                    | ...  |

The block of redundancy symbols of a column x of the table is obtained by calculating the sum of the matrix products of the blocks of information symbols of the first column of the table with the respective matrices of the column x.

Adopting more conventional notation, where [.] represents a vector or a matrix:

$$[ \ldots, R_3, R_4, R_5, \ldots ] = [ \ldots, D_0, D_1, D_2, \ldots ] \cdot \begin{bmatrix} \ddots & \ddots & \ldots & & \ldots & 0 \\ \ddots & \underline{M}_{0,0} & 0 & & & \vdots \\ \ddots & \underline{M}_{1,0} & \underline{M}_{1,1} & 0 & & \\ \vdots & 0 & \underline{M}_{0,1} & \underline{M}_{0,0} & 0 & \\ & & 0 & \underline{M}_{1,0} & \underline{M}_{1,1} & \ddots & \vdots \\ \vdots & & & 0 & \underline{M}_{0,1} & \ddots & 0 \\ 0 & \ldots & & \ldots & 0 & \ddots & \ddots \end{bmatrix}$$

As indicated above, the matrix $$\underline{M} = \begin{bmatrix} \underline{M}_{0,0} & \underline{M}_{0,1} \\ \underline{M}_{1,0} & \underline{M}_{1,1} \end{bmatrix}$$

preferably results from a conventional correcting code.

The benefit of this construction is that, during decoding, the sub-matrices $\underline{M}_{\mu,v}$ of the base matrix $\underline{M}$ appear, which makes it possible to use the properties of the corresponding code, in particular at the level of the decoding algorithm, and to benefit from the correction capacity of this code. For example, if the bursts $B_0$, $B_1$, $B_3$ and $B_4$ are received, the block of information symbols $D_2$ of burst $B_2$ can be found using the equations $R_3=D_1 \underline{M}_{1,1}+D_2 \underline{M}_{0,1}$ and $R_4=D_2 \underline{M}_{0,0}+D_3 \underline{M}_{1,0}$, which will reveal the matrices $\underline{M}_{0,0}$ and $\underline{M}_{0,1}$ which form a sub-matrix of the matrix $\underline{M}$. If, for example, the correcting code selected is a Reed-Solomon code (ideal for an erasure channel), recovery is optimal, i.e. all the redundancy symbols are useful.

Figure 4:
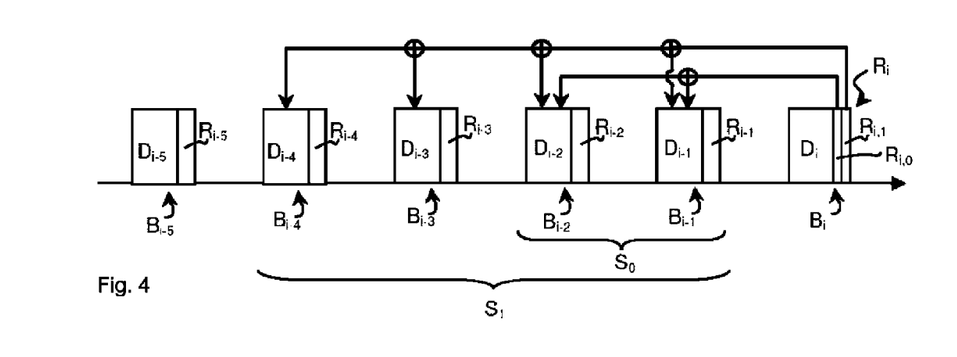
FIG. 4 is a schematic illustration of a second preferred embodiment of the invention.

FIG. 4 is a schematic illustration of a second preferred embodiment of the invention. According to this embodiment, the blocks of redundancy symbols are composed each time of $Z \geq 2$ sub-blocks $R_{i,z}$, $z=0,1, \ldots, Z-1$, which FIG. 4 shows explicitly only for the block $R_i$ with sub-blocks $R_{i,0}$ and $R_{i,1}$. The length of each sub-block $R_{i,z}$ is designated $L_z$. $L_z$ does not depend on i and $L_{z=0}+L_{z=1}+\ldots+L_{z=Z}=L_R$ is obtained. In the present example, it is proposed to construct the redundancy sub-blocks $R_{i,z}$ of the burst $B_i$ each time in the same way as the first embodiment of the invention, i.e. from blocks of information symbols $D_{i-s(z)}, \ldots, D_{i-s(z)+(t(z)-1)}$ of a series of t(z) bursts preceding the current burst $B_i$ in the sequence. The number s(z) is an integer indicating the start of the series of t(z) bursts, with $s(z) \geq (z)$, for any z=0, Z-1. Specifically, the sub-block of redundancy symbols $R_{i,z}$ of the current burst is obtained by addition (defined on $F^{L_z}$) of a series of coding values $(C_w)_{w=i-s(z), \ldots, i-s(z)+(t(z)-1)}$ relating to the series of bursts $(B_w)_{w=i-s(z), \ldots, i-s(z)+(t(z)-1)}$ preceding the current burst $B_i$, each coding value $C_w$ being obtained by a respective coding function applied to the block of information symbols $D_w$ of the burst $B_w$.

Strictly speaking, for a given $z \in \{0, \ldots, Z\}$ and burst $B_i$, the following applies:

$$C_u^{(w)} = \sum_{v=0}^{L_D-1} \alpha_{u,v}^{(w)} \cdot d_v^{(w)} \text{ et } r_u^{(i)} = \sum_{w=i-s}^{i-s(z)+(t(z)-1)} C_u^{(w)}$$

in which $c_u^{(w)}$, $u=0, L_z-1$ are the coefficients in F of the vector $C_w$ and in which the $\alpha_{u,v}^{(w)}$, $u=0, \ldots, L_z-1$, $v=0, L_D-1$ are the coefficients in F of the generator matrix $\underline{A}_{w,z}$ of the correcting code (i.e. of the coding function) associated with the position w of the series of bursts $(B_w)_{w=i-s(z), \ldots, i-s(z)+(t(z)-1)}$. The symbols $r_u^{(i)}$, $u=0, L_z-1$ here denote the coefficients in F of the block $R_{i,z}$. This may be written as follows:

$$R_{i,z} = \sum_{w=i-s(z)}^{i-s(z)+(t(z)-1)} D_w \underline{A}_{w,z}.$$

The generator matrices $\underline{\underline{A}}_{w,z}$ may be constructed, individually for each $z \in \{0, Z\}$ in a manner similar to the matrices $A_w$ discussed above, with substitution of $t(z)$ instead of $t$. Z independent systems of coding are thus obtained. They could even be implemented on different finite fields.

Let us consider, for example, a generator matrix $\underline{\underline{M(z)}}$ of $t(z) \cdot L_D$ rows and $t(z) \cdot L_z$ columns of a correcting code. The matrix $\underline{\underline{M(z)}}$ can be divided into $t(z) \cdot t(z)$ sub-matrices $\underline{\underline{M(z)}}_{\mu,\nu}$, $\mu=0, \ldots, t(z)-1$ and $v=0, t(z)-1$, each of which contains $L_D$ rows and $L_z$ columns:

$$\underline{\underline{M(z)}} = \begin{bmatrix} \underline{\underline{M(z)}}_{0,0} & \underline{\underline{M(z)}}_{0,1} & \cdots & \underline{\underline{M(z)}}_{0,t(z)-1} \\ \underline{\underline{M(z)}}_{1,0} & \underline{\underline{M(z)}}_{1,1} & & \vdots \\ \vdots & & \ddots & \vdots \\ \underline{\underline{M(z)}}_{t(z)-1,0} & \cdots & \cdots & \underline{\underline{M(z)}}_{t(z)-1,t(z)-1} \end{bmatrix}$$

The redundancy sub-blocks $R_{i,z}$ may be obtained by:

$$R_{i,z} = \sum_{\beta=0}^{t(z)-1} D_{\overline{i-s(z)+\beta}} \underline{\underline{M(z)}}_{\overline{i-s(z)+\beta},j}.$$

in which the notation "$\overline{x}$" here represents "x modulo $t(z)$".

In the example illustrated in FIG. 4, the redundancy sub-block $R_{i,0}$ is calculated on the basis of blocks of information symbols of the bursts of the series $S_0$ ($s(0)=t(0)=2$) while the redundancy sub-block $R_{i,1}$ is calculated on the basis of blocks of information symbols of the bursts of the series $S_1$ ($(s(1)=t(1)=4)$. This may therefore be written as follows: $R_{4,0}=D_2$ $\underline{\underline{M(0)}}_{0,0}+D_3\ \underline{\underline{M(0)}}_{1,0};\ R_{4,1}=D_0\ \underline{\underline{M(1)}}_{0,0}+D_1\ \underline{\underline{M(1)}}_{1,0}+D_2$ $\underline{\underline{M(1)}}_{2,0}+D_2\ \underline{\underline{M(1)}}_{3,0};\ R_{5,0}=D_3\ \underline{\underline{M(0)}}_{1,1}+D_4\ \underline{\underline{M(0)}}_{0,1};\ R_{5,1}=D_2$ $\underline{\underline{M(1)}}_{1,1}+D_2\ \underline{\underline{M(1)}}2,1+D_3\ \underline{\underline{M(1)}}_{3,1}+D4\ \underline{\underline{M(1)}}_{0,1}$, which is visualised with the assistance of the following table:

|     | $R_{4,0}$ | $R_{4,1}$ | $R_{5,0}$ | $R_{5,1}$ | $R_{6,0}$ | $R_{6,1}$ | $R_{7,0}$ | ... |
|-----|-----------|-----------|-----------|-----------|-----------|-----------|-----------|-----|
| $D_0$ |  | $\underline{\underline{M(1)}}_{0,0}$ |  |  |  |  |  |  |
| $D_1$ |  | $\underline{\underline{M(1)}}_{1,0}$ |  | $\underline{\underline{M(1)}}_{1,1}$ |  |  |  |  |
| $D_2$ | $\underline{\underline{M(0)}}_{0,0}$ | $\underline{\underline{M(1)}}_{2,0}$ |  | $\underline{\underline{M(1)}}_{2,1}$ |  | $\underline{\underline{M(1)}}_{2,2}$ |  |  |
| $D_3$ | $\underline{\underline{M(0)}}_{1,0}$ | $\underline{\underline{M(1)}}_{3,0}$ | $\underline{\underline{M(0)}}_{1,1}$ | $\underline{\underline{M(1)}}_{3,1}$ |  | $\underline{\underline{M(1)}}_{3,2}$ |  |  |
| $D_4$ |  |  | $\underline{\underline{M(0)}}_{0,1}$ | $\underline{\underline{M(1)}}_{0,1}$ | $\underline{\underline{M(0)}}_{0,0}$ | $\underline{\underline{M(1)}}_{0,2}$ |  |  |
| $D_5$ |  |  |  |  | $\underline{\underline{M(0)}}_{1,0}$ | $\underline{\underline{M(1)}}_{1,2}$ | $\underline{\underline{M(0)}}_{1,1}$ |  |
| $D_6$ |  |  |  |  |  |  | $\underline{\underline{M(0)}}_{0,1}$ | ... |
| ... |  |  |  |  |  |  |  | ... |

It should be noted that as the index i (number of burst in sequence) increases, the coding functions change cyclically, with a period $t(0)$ or $t(1)$ respectively.

According to this example, the zapping time is reduced thanks to the redundancy block based on the short series $S_0$ and increased reliability is achieved thanks to the redundancy block based on the longer series $S_1$.

There is another way of constructing the generator matrix $\underline{\underline{A}}_{w,z}$. The following may be noted: $f_{max}=\max_{z=0,\ldots,z}(t(z))$. A generator matrix is constructed from a correcting code $\underline{\underline{M'}}$ with $t_{max} \cdot Z \cdot L_D$ rows and $t_{max} \cdot (L_{z=0}+L_{z=1}+\ldots+L_{z=Z-1})$ columns. $\underline{\underline{M'}}$ can be divided into $t_{max} \cdot Z$ rows and $t_{max} \cdot Z$ columns of sub-matrices $\underline{\underline{M'}}_{\mu,\nu}$ $\mu=0, \ldots, t_{max}-1$ and $v=0, \ldots, t_{max}-1$, each of which is of the size $L_D \cdot L_Z$.

$$\underline{\underline{M'}} = \begin{bmatrix} \underline{\underline{M'}}_{0,0} & \underline{\underline{M'}}_{0,1} & \cdots & \underline{\underline{M'}}_{0,Z \cdot tmax-1} \\ \underline{\underline{M'}}_{1,0} & \underline{\underline{M'}}_{1,1} & & \vdots \\ \vdots & & \ddots & \vdots \\ \underline{\underline{M'}}_{Z \cdot tmax-1,0} & \cdots & \cdots & \underline{\underline{M'}}_{Z \cdot tmax-1,Z \cdot tmax-1} \end{bmatrix}$$

The redundancy sub-blocks $R_{i,z}$ may be obtained by:

$$R_{i,z} = \sum_{\beta=0}^{t(z)-1} D_{\overline{i-s(z)+\beta}} \underline{\underline{M'}}_{\overline{i-s(z)+\beta}, j \cdot Z + z}$$

in which the notation "$\overline{x}$" here represents "x modulo $Z \cdot t_{max}$".

With, for example, $Z=2$, $s(0)=t(0)=2$, $s(1)=t(1)=4$, the matrix $\underline{\underline{M'}}$ is composed of 8×8 sub-blocks and the coding system is summarised using the following table:

|     | $R_{4,0}$ | $R_{4,1}$ | $R_{5,0}$ | $R_{5,1}$ | $R_{6,0}$ | $R_{6,1}$ | $R_{7,0}$ | ... |
|-----|-----------|-----------|-----------|-----------|-----------|-----------|-----------|-----|
| $D_0$ |  | $\underline{\underline{M'}}_{0,1}$ |  |  |  |  |  |  |
| $D_1$ |  | $\underline{\underline{M'}}_{1,1}$ |  | $\underline{\underline{M'}}_{1,3}$ |  |  |  |  |
| $D_2$ | $\underline{\underline{M'}}_{2,0}$ | $\underline{\underline{M'}}_{2,1}$ |  | $\underline{\underline{M'}}_{2,3}$ |  | $\underline{\underline{M'}}_{2,5}$ |  |  |
| $D_3$ | $\underline{\underline{M'}}_{3,0}$ | $\underline{\underline{M'}}_{3,1}$ | $\underline{\underline{M'}}_{3,2}$ | $\underline{\underline{M'}}_{3,3}$ |  | $\underline{\underline{M'}}_{3,5}$ |  |  |
| $D_4$ |  |  | $\underline{\underline{M'}}_{4,2}$ | $\underline{\underline{M'}}_{4,3}$ | $\underline{\underline{M'}}_{4,4}$ | $\underline{\underline{M'}}_{4,5}$ |  |  |
| $D_5$ |  |  |  |  | $\underline{\underline{M'}}_{5,4}$ | $\underline{\underline{M'}}_{5,5}$ | $\underline{\underline{M'}}_{5,6}$ |  |
| $D_6$ |  |  |  |  |  |  | $\underline{\underline{M'}}_{6,6}$ | ... |
| ... |  |  |  |  |  |  |  | ... |

Only the case PE=1 has hitherto been discussed. It is easy to extend the above examples to the case PE>1 by adding the numbering index j, j=0, PE-1, of the information or redundancy symbol blocks in the stated formulae. For each j, the following is thus obtained:

$$R_i^j = \sum_{w=i-s}^{i-s+(t-1)} D_w^j \underline{\underline{A}}_w^j$$

or $$R_{i,z}^j = \sum_{w=i-s(z)}^{i-s(z)+(t(z)-1)} D_w^j \underline{\underline{A}}_{w,z}^j$$

In principle, the matrices $\underline{\underline{A}}_w^j$ or $\underline{\underline{A}}_{w,z}^j$ may be individually selected for each j. Preferably, however, the same matrices $\underline{\underline{A}}_w$ or $\underline{\underline{A}}_{w,z}$ are used for all the indices j.

At the level of the receiver, the coding functions (and thus the matrices representing them) are known. When a burst is not correctly received or is not received at all, the receiver resolves a system of equations to reconstruct the lost information data. Suitable reconstruction algorithms are within the abilities of a person skilled in the art on the basis of the description of the encoding process according to the invention. If series of bursts of different lengths are used to obtain a plurality of systems of redundancy sub-blocks, reconstruction of lost data may be performed on the basis of redundancy blocks of just one or multiple series, as required. If the lost data can be reconstructed on the basis of the shortest series, a very short latency time is achieved. If the loss is on a larger scale (e.g. over multiple consecutive bursts), the redundancy of the shortest series may possibly no longer be sufficient for reconstruction and the longer series will have to be taken into account in respect of reconstruction. The longer series therefore ensure increased overall reliability of the system.

The invention claimed is:

1. A process of encoding information data in a sequence of bursts ($\ldots, B_{i-2}, B_{i-1}, B_i, B_{i+1}, \ldots$), each burst comprising a block of information symbols ($D_i$) and a block of redundancy symbols ($R_i$), the process comprising generation of the block of redundancy symbols ($R_i$) of a current burst ($B_i$) of the sequence from information symbols of the blocks of information symbols of a plurality of bursts of the sequence;

characterised in that generation of the block of redundancy symbols ($R_i$) of the current burst comprises generation of a first sub-block ($R_{i,0}$) of the block of redundancy symbols ($R_i$) of the current burst ($B_i$), which includes calculation of a coding value by a coding function applied to the block of information symbols of a burst of the sequence other than the current burst, or calculation of a sum of a first series of coding values relating to a first series ($S_0$) of bursts ($B_{i-2}, B_{i-1}$), each coding value of the first series of coding values being obtained by a respective coding function applied to the block of information symbols of the corresponding burst of the first series ($S_0$) of bursts;

and generation of a second sub-block ($R_{i,1}$) of the block of redundancy symbols ($R_i$) of the current burst ($B_i$), which includes calculation of a sum of a second series of coding values relating to a second series ($S_1$) of bursts ($B_{i-4}, B_{i-3}, B_{i-2}, B_{i-1}$), each coding value of the second series of coding values being obtained by a respective coding function applied to the block of information symbols of the corresponding burst of the second series ($S_1$) of bursts, the first ($S_0$) and second ($S_1$) series of bursts being of different lengths, and each coding function being a function, which, applied to a block of symbols, provides, as coding value, the redundancy symbols of a correcting code and which has the property of using all the symbols of the block to which it is applied, such that, if the value of any single symbol of the block is changed, the coding value obtained also changes.

2. The process according to claim 1, in which the first ($S_0$) and second ($S_1$) series of bursts are series of bursts preceding the current burst ($B_i$), preferably immediately.

3. The process according to claim 1, in which each burst comprises an ordered structure of blocks of information symbols ($D_i^o, D_i^j, D_i^{PE-1}$) and an ordered structure of blocks of redundancy symbols ($R_i^o, R_i^j, R_i^{PE-1}$), the number of blocks of information symbols in the ordered structure of blocks of information symbols being equal to the number of blocks of redundancy symbols in the ordered structure of blocks of redundancy symbols;

in which the generation of each block of the ordered structure of blocks of redundancy symbols of the current burst ($B_i$) comprises the generation of a first sub-block and of a second sub-block;

generation of the first sub-block including calculation of a coding value by a coding function applied to the block of information symbols located in the corresponding position (j) in the ordered structure of the burst other than the current burst, or calculation of a sum of a first series of coding values relating to the blocks located in the corresponding position in the ordered structure of blocks of information symbols of the bursts of the first series ($S_0$) of bursts, each coding value of the first series of coding values being obtained by a respective coding function applied to the block of information symbols located in the corresponding position (j) in the ordered structure of blocks of information symbols of the corresponding burst of the first series ($S_0$) of bursts;

and generation of the second sub-block including calculation of a sum of a second series of coding values relating to the blocks located in the corresponding position (j) in the ordered structure of blocks of information symbols of the bursts of the second series ($S_1$) of bursts, each coding value of the second series of coding values being obtained by a respective coding function applied to the block of information symbols located in the corresponding position (j) in the ordered structure of blocks of information symbols of the corresponding burst of the second series ($S_1$) of bursts.

4. The process according to claim 3, in which the first ($S_0$) and second ($S_1$) series of bursts are series of bursts preceding the current burst ($B_i$), preferably immediately.

5. The process according to claim 3, in which the number of blocks of information symbols in the ordered structure of blocks of information symbols is in the range from 1 to 1000.

6. The process according to claim 1, comprising repetition of the step of generating the block of redundancy symbols for one or more subsequent bursts ($B_{i+1}, \ldots$) which in turn become the current burst.

7. The process according to claim 6, in which the coding functions remain unchanged during repetition of the step of generating the block of redundancy symbols for the subsequent bursts ($B_{i+1}, \ldots$).

8. The process according to claim 6, in which the coding functions are changed cyclically during repetition of the step of generating the block of redundancy symbols for the subsequent bursts ($B_{i+1}, \ldots$).

9. The process according to claim 1, in which the information symbols and the redundancy symbols are elements of a finite field.

* * * * *